(12) United States Patent
Wang et al.

(10) Patent No.: US 11,910,636 B2
(45) Date of Patent: Feb. 20, 2024

(54) DISPLAY SUBSTRATE INCLUDING AN AUXILIARY CATHODE STRUCTURE AND DISPLAY APPARATUS HAVING THE SAME

(71) Applicants: Hefei Xinsheng Optoelectronics Technology Co., Ltd., Anhui (CN); BOE Technology Group Co., Ltd., Beijing (CN)

(72) Inventors: Qinghe Wang, Beijing (CN); Jun Cheng, Beijing (CN); Tongshang Su, Beijing (CN); Ning Liu, Beijing (CN); Haitao Wang, Beijing (CN); Yongchao Huang, Beijing (CN); Jingang Fang, Beijing (CN); Liusong Ni, Beijing (CN); Liangchen Yan, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 176 days.

(21) Appl. No.: 17/481,327

(22) Filed: Sep. 22, 2021

(65) Prior Publication Data
US 2022/0255038 A1 Aug. 11, 2022

(30) Foreign Application Priority Data
Feb. 5, 2021 (CN) .......................... 202110163789.2

(51) Int. Cl.
*H01L 29/08* (2006.01)
*H10K 50/824* (2023.01)
(Continued)

(52) U.S. Cl.
CPC ......... *H10K 50/824* (2023.02); *H10K 77/111* (2023.02); *H10K 2102/103* (2023.02); *H10K 2102/311* (2023.02)

(58) Field of Classification Search
CPC .............. H10K 50/824; H10K 71/111; H10K 2102/311; H10K 2102/103
(Continued)

(56) References Cited

U.S. PATENT DOCUMENTS

2015/0137097 A1 5/2015 Choi et al.
2016/0211316 A1 7/2016 Oh et al.
(Continued)

OTHER PUBLICATIONS

Office Action dated Mar. 29, 2022 for Chinese Patent Application No. 202110163789.2 and English Translation.

*Primary Examiner* — Phuc T Dang
(74) *Attorney, Agent, or Firm* — Ling Wu; Stephen Yang; Ling and Yang Intellectual Property

(57) ABSTRACT

Provided are a display substrate and a display apparatus. The display substrate includes a base substrate, and an auxiliary cathode structure located on a side of the base substrate, the auxiliary cathode structure including a first conductive layer, an intermediate support layer, and a second conductive layer. In an implementation, a side of the intermediate support layer close to the first conductive layer includes any one or more of first protrusions and first grooves, and a side of the first conductive layer close to the intermediate support layer includes any one or more of second grooves engaged with the first protrusions and second protrusions engaged with the first grooves which are correspondingly disposed.

17 Claims, 9 Drawing Sheets

(51) Int. Cl.
*H10K 77/10* (2023.01)
*H10K 102/10* (2023.01)
*H10K 102/00* (2023.01)

(58) Field of Classification Search
USPC .......................................................... 257/40
See application file for complete search history.

(56) References Cited

U.S. PATENT DOCUMENTS

| | | |
|---|---|---|
| 2017/0133620 A1 | 5/2017 | Lee et al. |
| 2017/0170246 A1* | 6/2017 | Im ........................ H10K 50/814 |
| 2018/0190944 A1* | 7/2018 | Lee ..................... H10K 59/1213 |
| 2019/0058153 A1 | 2/2019 | Luo |
| 2020/0091255 A1* | 3/2020 | Wang ...................... H10K 59/38 |
| 2021/0202890 A1* | 7/2021 | Kim ........................ H10K 59/38 |

* cited by examiner

DISPLAY SUBSTRATE INCLUDING AN AUXILIARY CATHODE STRUCTURE AND DISPLAY APPARATUS HAVING THE SAME

CROSS-REFERENCE TO RELATED APPLICATION

The present application claims the priority of Chinese Patent Application No. 202110163789.2 filed to the CNIPA on Feb. 5, 2021, the content of which is incorporated herein by reference.

TECHNICAL FIELD

Embodiments of the present disclosure relate to, but are not limited to, the technical field of display, in particular to a display substrate and a display apparatus.

BACKGROUND

Organic Light Emitting Diode (OLED) display devices have attracted an increasing attention due to advantages such as thinness, lightness, active light emission, low cost, easiness to form flexible structure, wide viewing angle, etc.

An OLED display device may generally include an anode, an organic light emitting layer, and a cathode. In order to meet luminous quality requirements for top emission-type OLED display products, an auxiliary cathode structure will be added in this kind of products to connect the cathode with metal wirings. Therefore, improving stability of the auxiliary cathode structure is of great significance for improving stability of OLED display products.

SUMMARY

The following is a summary of the subject matter described in detail in the present disclosure. This summary is not intended to limit the scope of protection of the claims.

In a first aspect, an embodiment of the present disclosure provides a display substrate, including a base substrate and an auxiliary cathode structure located on a side of the base substrate; the auxiliary cathode structure includes a first conductive layer, an intermediate support layer located on a side of the first conductive layer away from the base substrate, and a second conductive layer located on a side of the intermediate support layer away from the first conductive layer; wherein, a side of the intermediate support layer close to the first conductive layer includes any one or more of at least one first protrusion and at least one first groove, and a side of the first conductive layer close to the intermediate support layer includes any one or more of at least one second groove engaged with the at least one first protrusion and at least one second protrusion engaged with the at least one first groove which are correspondingly disposed; and/or, a side of the intermediate support layer away from the first conductive layer includes any one or more of at least one third protrusion and at least one third groove, and a side of the second conductive layer close to the intermediate support layer includes any one or more of at least one fourth groove engaged with the at least one third protrusion and at least one fourth protrusion engaged with the at least one third groove which are correspondingly disposed.

In a second aspect, an embodiment of the present disclosure provides a display apparatus, including any of the above-mentioned display substrate.

Other features and advantages of the present disclosure will be set forth in the subsequent description, and, in part, become apparent from the description, or be understood by implementing the present disclosure. Other advantages of the present disclosure may be implemented and achieved by solutions described in the specification and accompanying drawings.

After reading and understanding the drawings and the detailed description, other aspects may be understood.

BRIEF DESCRIPTION OF DRAWINGS

The drawings are used to facilitate understanding of technical solutions of the present disclosure, and form a part of the specification, and are used to explain, together with embodiments of the present disclosure, the technical solutions of the present disclosure, without constituting limits to the technical solutions of the present disclosure. Shapes and sizes of each component in the drawings do not reflect true proportions, and are only used to schematically illustrate contents of the present invention.

DETAILED DESCRIPTION

Figure 1:
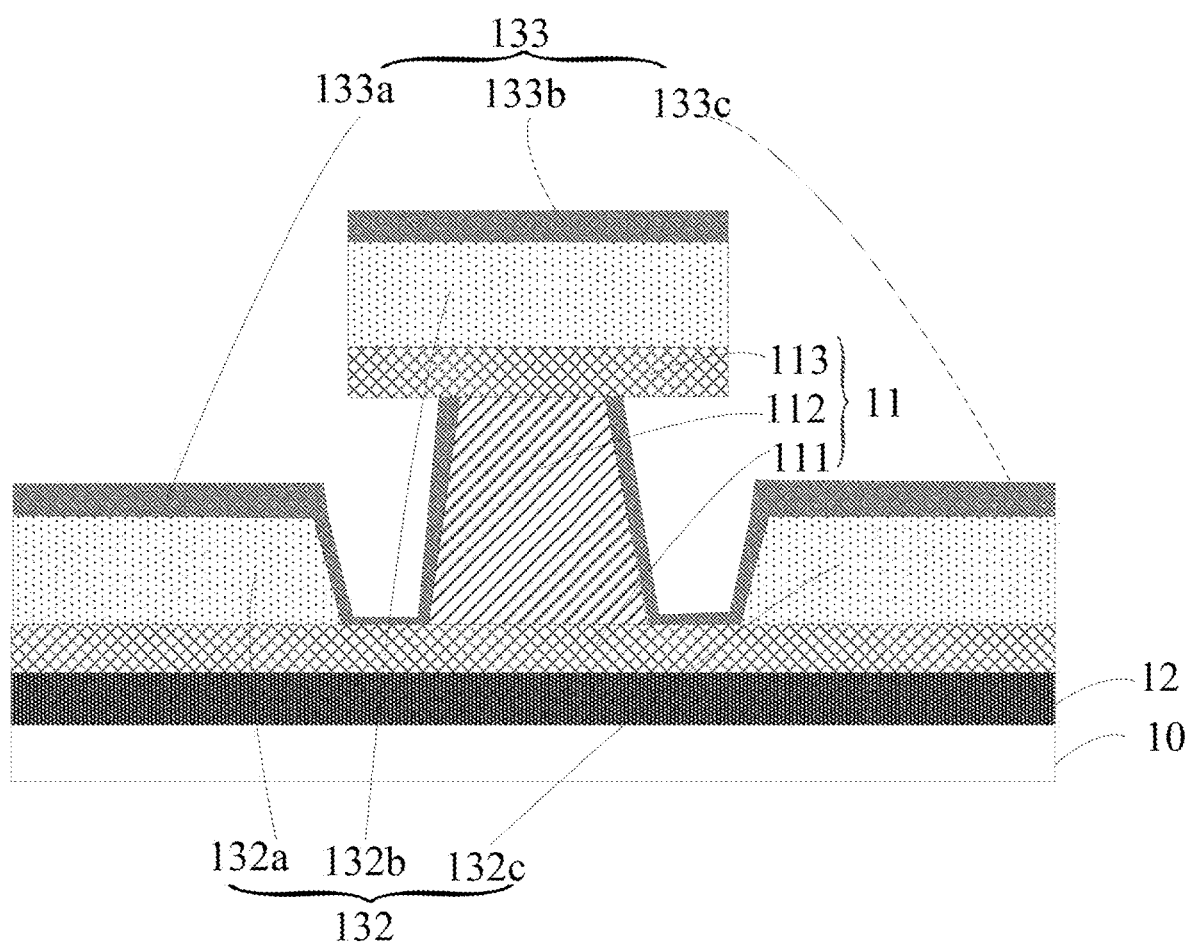
FIG. 1 is a schematic diagram of a structure of an auxiliary cathode structure.

Multiple embodiments are described in the present disclosure, but the description is exemplary rather than limiting, and there may be more embodiments and implementation solutions within the scope contained by the embodiments described in the present disclosure. Although many possible feature combinations are shown in the drawings, and discussed in specific implementations, the disclosed features may also be combined in many other modes. Unless specifically limited, any feature or element of any embodiment may be used in combination with or in place of any other feature or element in any other embodiment.

When describing representative embodiments, the specification may have presented methods and/or processes as a specific order of acts. However, to the extent that the method or the process does not depend on the specific order of acts in the present disclosure, the method or the process should not be limited to the specific order of acts. As understood by those of ordinary skill in the art, another order of acts is also possible. Therefore, the specific order of acts set forth in the specification should not be interpreted as limiting the claims. In addition, the claims for the method and/or the process should not be limited to performing their acts in the written order. Those skilled in the art may easily understand that these orders may be changed, and still remain within the spirit and the scope of the embodiments of the present disclosure.

In the drawings, a size of each constituent element, or a thickness or a region of a layer, is sometimes exaggerated for clarity. Therefore, one mode of the present invention is not necessarily limited to the size, and a shape and a size of each component in the drawings do not reflect true proportions. In addition, the drawings schematically illustrate ideal examples, and one mode of the present invention is not limited to the shapes, or numerical values, etc., illustrated in the drawings.

The "first", "second", "third", and other ordinal numbers in the present disclosure are set to avoid confusion of constituent elements, but not used to limit on an aspect of quantity.

In the present disclosure, for the sake of convenience, wordings such as "central", "upper", "lower", "front", "rear", "vertical", "horizontal", "top", "bottom", "inner", "outer", or the like indicating orientations or positional relations are used to constitute positional relations of elements with reference to descriptions of the drawings, which are only for being convenient for describing the present disclosure and simplifying descriptions, rather than for indicating or implying that the apparatus or the element referred to must have a specific orientation, or must be constructed and operated in a particular orientation, and therefore, those wordings cannot be construed as limitations on the present invention. The positional relations of the constituent elements are appropriately changed according to the direction in which constituent elements are described. Therefore, the wordings described herein are not restrictive, and may be appropriately replaced according to a situation.

In the present disclosure, a transistor refers to an element at least including three terminals, namely, a gate electrode, a drain electrode, and a source electrode. The transistor has a channel region between the drain electrode (a drain electrode terminal, a drain region, or a drain electrode) and the source electrode (a source electrode terminal, a source region, or a source electrode), and the current can flow through the drain electrode, the channel region, and the source electrode. In the present disclosure, the channel region refers to a region through which the current mainly flows. Functions of "the source electrode" and "the drain electrode" may sometimes be exchanged when transistors of opposite polarities are used, or when the current direction changes during a circuit operation, etc. Therefore, in the present disclosure, "the source electrode" and "the drain electrode" are interchangeable.

In the present disclosure, "parallel" refers to a state in which an angle formed by two straight lines is greater than or equal to −10°, and smaller than or equal to 10°, and thus includes a state in which the angle is greater than or equal to −5°, and smaller than or equal to 5°. In addition, "vertical" refers to a state in which an angle formed by two straight lines is greater than or equal to 80°, and smaller than or equal to 100°, therefore including a state in which the angle is greater than or equal to 85°, and smaller than or equal to 95°.

In the present disclosure, "about" refers to a numerical value within a range of allowable process and measurement errors without strictly limiting the limit.

In an embodiment of the present disclosure, "multiple" means two or more than two, unless otherwise specified. "At least one of A and B" and "A and/or B" have a same meaning, and both include the following three combinations: only A, only B, and a combination of A and B.

In an embodiment of the present disclosure, a depth of a groove may refer to a length feature of the groove in a direction away from a base substrate on a plane perpendicular to a display substrate. A height of a protrusion may refer to a length feature of the protrusion in a direction away from the base substrate on the plane perpendicular to the display substrate.

An OLED display device may generally include an anode, an organic light emitting layer, and a cathode. OLED may be a bottom emission-type OLED, or a top emission-type OLED. In a top emission-type OLED display device, the cathode usually uses a relatively thin transparent conductive material to realize a connection with a signal line in a non-display region (being a region in which no pixels are disposed, and no images are displayed) on a periphery of a display region (being a region in which pixels are disposed so as to display images), which is prone to produce a problem of a relatively poor luminous quality. Therefore, a conductive metal in a metal wiring layer is usually connected to the cathode through an auxiliary cathode structure, to improve luminous quality. However, as shown in FIG. 1, in a current auxiliary cathode structure, an intermediate support layer is in a planar contact with both a first conductive layer and a second conductive layer, which makes the intermediate support layer easily separated from the first conductive layer and the second conductive layer, thereby resulting in that support loses effectiveness. In addition, a thickness of an electrode in a part of the cathode connected to the first conductive layer is thinner, which makes the cathode extremely easy to break, thus making the intermediate support layer easier to separate from the first conductive layer and the second conductive layer, resulting in relatively poor stability of the auxiliary cathode structure. Furthermore, it is caused that a display product applied with the auxiliary cathode structure has relatively poor bending reliability, and relatively poor product stability. Therefore, improving the stability of the auxiliary cathode structure is of great significance for improving stability and service life of OLED display products.

An embodiment of the present disclosure provides a display substrate. On a plane parallel to the display substrate, the display substrate may include a base substrate, and an auxiliary cathode structure located on a side of the base substrate; the auxiliary cathode structure may include a first conductive layer, an intermediate support layer located on a side of the first conductive layer away from the base substrate, and a second conductive layer located on a side of the intermediate support layer away from the first conductive layer. Herein, a side of the intermediate support layer close to the first conductive layer may include any one or more of at least one first protrusion and at least one first groove, and correspondingly, a side of the first conductive layer close to the intermediate support layer may include any one or more of at least one second groove engaged with the at least one first protrusion and at least one second protrusion engaged with the at least one first groove which are correspondingly disposed; and/or, a side of the intermediate support layer away from the first conductive layer includes any one or more of at least one third protrusion and at least one third groove, and correspondingly, a side of the second conductive layer close to the intermediate support layer includes any one or more of at least one fourth groove engaged with the at least one third protrusion and at least one fourth protrusion engaged with the at least one third groove which are correspondingly disposed.

In this way, a contact area between the intermediate support layer and the first conductive layer can be increased, by fitting between the first protrusion and the second groove, or by fitting between the first groove and the second protrusion, so that the intermediate support layer and the first conductive layer are not easily separated, which may improve structural stability between the intermediate support layer and the first conductive layer. However, by fitting the third protrusion with the fourth groove, or by fitting the third groove with the fourth protrusion, a contact area between the intermediate support layer and the second conductive layer can be increased, which may improve structural stability between the intermediate support layer and the second conductive layer. Therefore, a bonding force between the intermediate support layer and the first and second conductive layers may be improved, by a film layer embedding effect, thus it may be caused that the intermediate support layer is not easy to separate from the first and second conductive layers, which may improve the structural stability of the auxiliary cathode structure, and effectiveness losing is more difficult. Furthermore, when the display substrate with the auxiliary cathode structure is applied to a flexible and bendable display product, flexible bending may be resisted, improving connection stability of bending and bending in each direction, and improving bending reliability and stability of the product, which thus can prolong service life of the product.

In an exemplary embodiment, a position where the first protrusion is disposed corresponds to a position where the second groove is disposed, and the first protrusion is located within the second groove, engaged and connected with the second groove. Similarly, a position where the first groove is disposed corresponds to a position where the second protrusion is disposed, and the second protrusion is located within the first groove, engaged and connected with the first groove; a position where the third protrusion is disposed corresponds to a position where the fourth groove is disposed, and the third protrusion is located within the fourth groove, engaged and connected with the fourth groove. A position where the third groove is disposed corresponds to a position where the fourth protrusion is disposed, and the fourth protrusion is located within the third groove, engaged and connected with the third groove.

In an exemplary embodiment, the first protrusion is disposed on a side of the intermediate support layer close to the first conductive layer, and protrudes toward a direction close to the base substrate. The first groove is disposed on a side of the intermediate support layer close to the first conductive layer, and is recessed toward a direction away from the base substrate. The second groove is disposed on a side of the first conductive layer close to the intermediate support layer, and is recessed toward the direction close to the base substrate. The second protrusion is disposed on a side of the first conductive layer close to the intermediate support layer, and protrudes towards the direction away from the base substrate. The third protrusion is disposed on a side of the intermediate support layer away from the first conductive layer, and protrudes towards the direction away from the base substrate. The third groove is disposed on a side of the intermediate support layer away from the first conductive layer, and is recessed toward the direction close to the base substrate. The fourth groove is disposed on a side of the second conductive layer close to the intermediate support layer, and is recessed towards the direction away from the base substrate. The fourth protrusion is disposed on a side of the second conductive layer close to the intermediate support layer, and protrudes toward the direction close to the base substrate.

In an exemplary embodiment, a quantity of the first protrusion, the second protrusion, the third protrusion, the fourth protrusion, the first groove, the second groove, the third groove, and the fourth groove may be arbitrarily disposed. For example, a quantity of the first protrusion, the second protrusion, the third protrusion, the fourth protrusion, the first groove, the second groove, the third groove, and the fourth groove may all be one or more. Among them, quantities of the first protrusion and the second groove may be same, quantities of the first groove and the second protrusion may be same, quantities of the third protrusion and the fourth groove may be same, and quantities of the third groove and the fourth protrusion may be same.

In an exemplary embodiment, when quantities of grooves and protrusions which are correspondingly disposed may both be multiple, the multiple grooves and the multiple protrusions corresponding to them are all disposed in a one-to-one correspondence, and the protrusions may engage into their corresponding grooves. For example, taking the quantities of the first protrusions and the second grooves both being multiple as an example, the multiple first protrusions are disposed in a one-to-one correspondence with the multiple second grooves, and each first protrusion may engage into its corresponding second groove.

Next, taking the quantities of the first protrusion, the second protrusion, the third protrusion, the fourth protrusion, the first groove, the second groove, the third groove, and the fourth groove being one, respectively, as an example, the display substrate provided by the embodiment of the present disclosure will be described in detail with reference to FIGS. 2, 3, 4, 5, 6, 7, 8, and 9.

Figure 2:
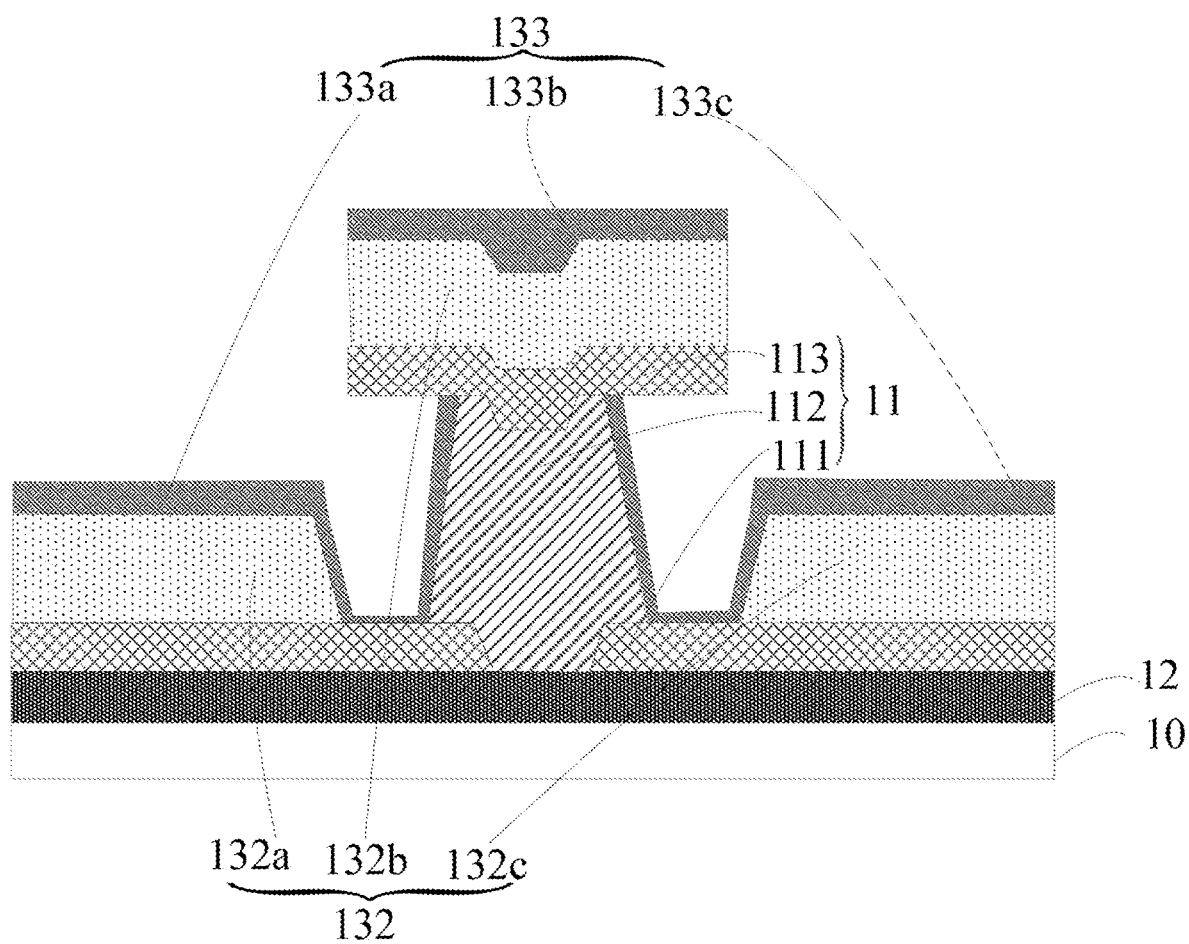
FIG. 2 is a schematic diagram of a structure of a display substrate according to an embodiment of the present disclosure.

FIG. 2 is a schematic diagram of a structure of a display substrate according to an embodiment of the present disclosure. As shown in FIG. 2, on a plane parallel to the display substrate, the display substrate may include a base substrate 10, and an auxiliary cathode structure 11 on a side of the base substrate 10; the auxiliary cathode structure 11 may include a first conductive layer 111, an intermediate support layer 112 on a side of the first conductive layer 111 away from the base substrate 10, and a second conductive layer 113 on a side of the intermediate support layer 112 away from the first conductive layer 111. Herein, a side of the intermediate support layer 112 close to the first conductive layer 111 includes a first protrusion; a side of the first conductive layer 111 close to the intermediate support layer 112 includes a second groove correspondingly disposed and engaged with the first protrusion; in addition, a side of the intermediate support layer 112 away from the first conductive layer 111 includes a third groove, and a side of the second conductive layer 113 close to the intermediate support layer 112 includes a fourth protrusion correspondingly disposed and engaged with the third groove. Here, one first protrusion, one second groove, one third groove, and one fourth protrusion are shown in FIG. 2. In another exemplary embodiment, the first protrusion and the second groove may both be disposed to multiple, and the third groove and the fourth protrusion may both be disposed to one. Or, the first protrusion and the second groove may both be disposed to multiple, and the third groove and the fourth protrusion may both be disposed to multiple.

Figure 3:
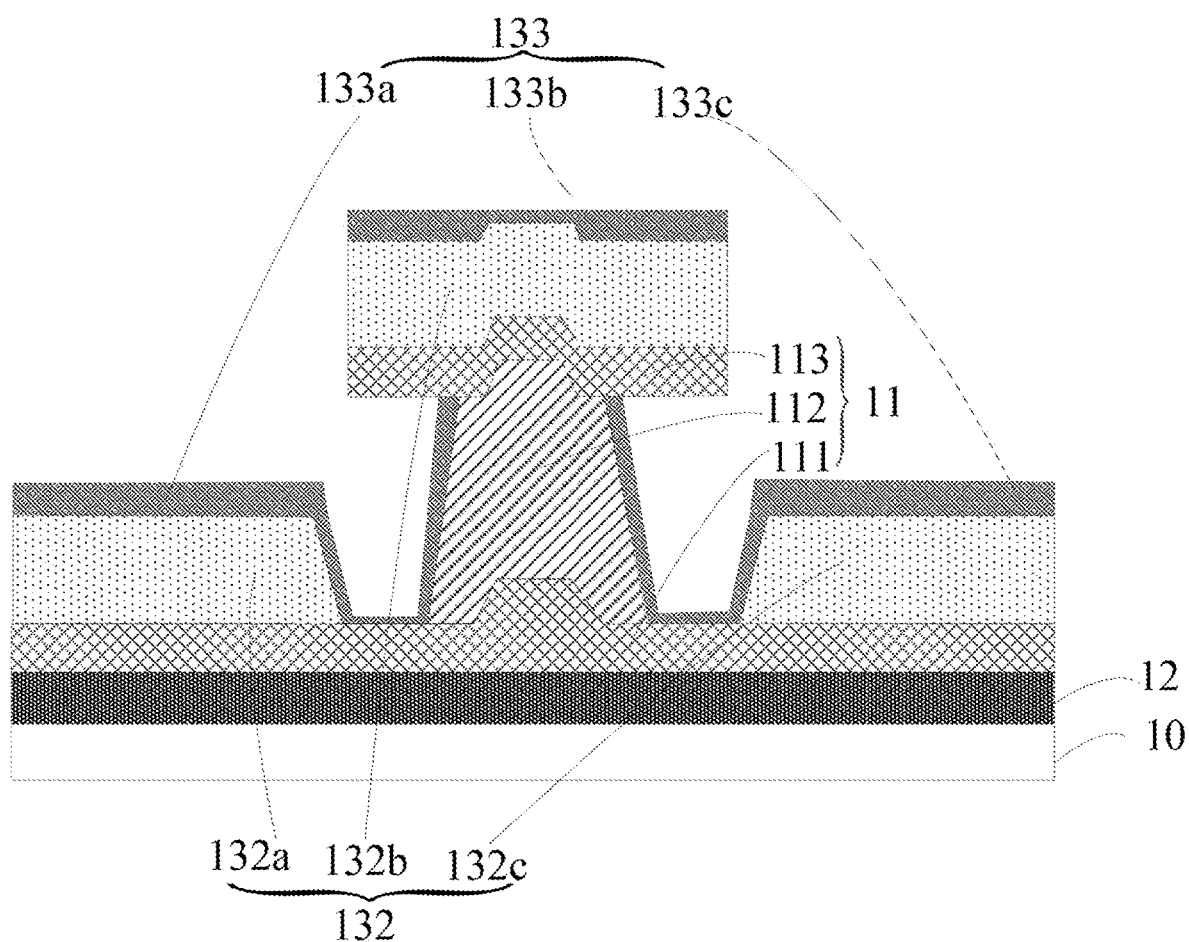
FIG. 3 is a schematic diagram of another structure of a display substrate according to an embodiment of the present disclosure.

FIG. 3 is a schematic diagram of another structure of a display substrate according to an embodiment of the present disclosure. As shown in FIG. 3, on a plane parallel to the display substrate, the display substrate may include a base substrate 10, and an auxiliary cathode structure 11 on a side of the base substrate 10; the auxiliary cathode structure 11 may include a first conductive layer 111, an intermediate support layer 112 on a side of the first conductive layer 111 away from the base substrate 10, and a second conductive layer 113 on a side of the intermediate support layer 112 away from the first conductive layer 111. Herein, a side of the intermediate support layer 112 close to the first conductive layer 111 includes a first groove; a side of the first conductive layer 111 close to the intermediate support layer 112 includes a second protrusion correspondingly disposed and engaged with the first groove; in addition, a side of the intermediate support layer 112 away from the first conductive layer 111 includes a third protrusion, and a side of the second conductive layer 113 close to the intermediate support layer 112 includes a fourth groove correspondingly disposed and engaged with the third protrusion. Here, one first groove, one second protrusion, one third protrusion, and one fourth groove are shown in FIG. 3. In another exemplary embodiment, the first groove and the second protrusion may both be disposed to multiple, and the third protrusion and the fourth groove may both be disposed to one. Or, the first groove and the second protrusion may both be disposed to multiple, and the third protrusion and the fourth groove may both be disposed to multiple.

Figure 4:
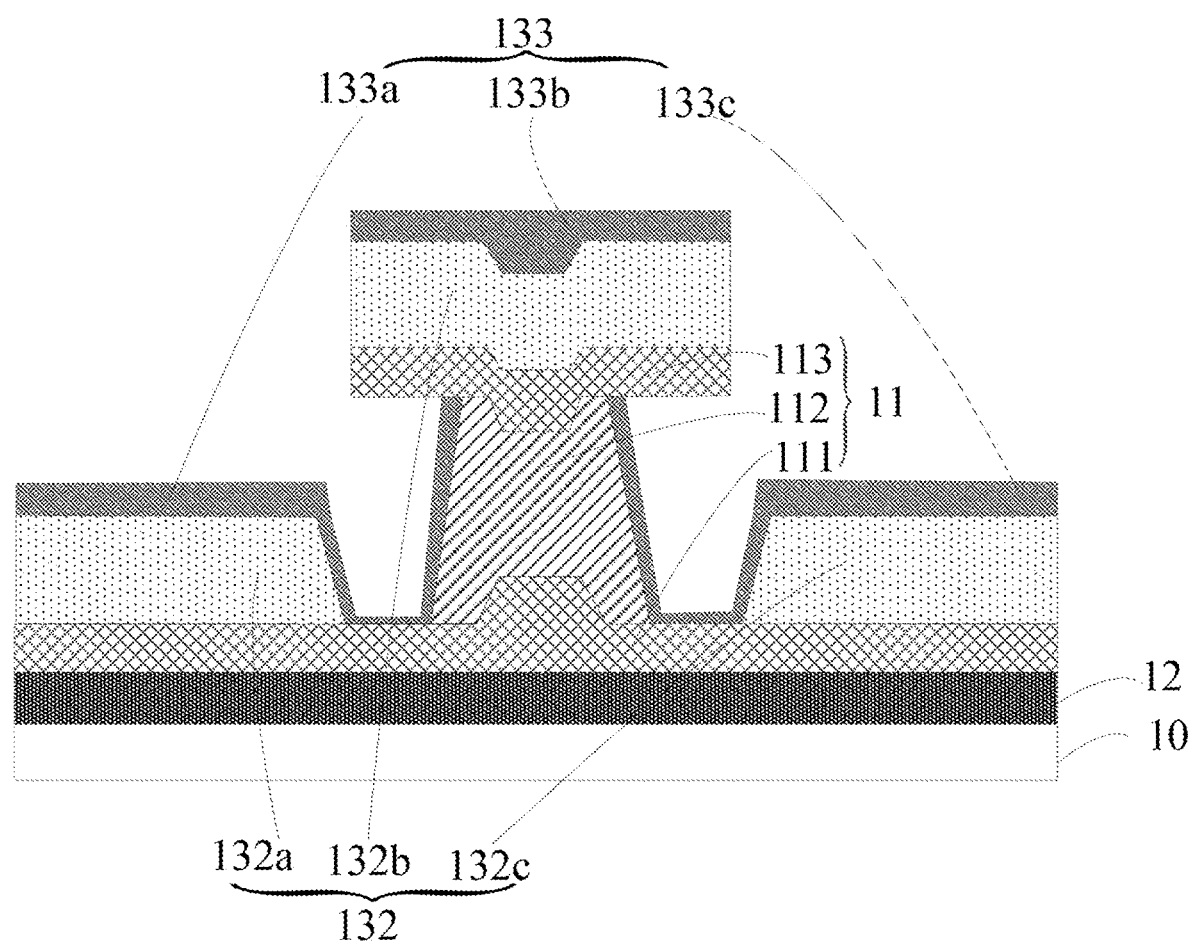
FIG. 4 is a schematic diagram of yet another structure of a display substrate according to an embodiment of the present disclosure.

FIG. 4 is a schematic diagram of yet another structure of a display substrate according to an embodiment of the present disclosure. As shown in FIG. 4, on a plane parallel to the display substrate, the display substrate may include a base substrate 10, and an auxiliary cathode structure 11 on a side of the base substrate 10; the auxiliary cathode structure 11 may include a first conductive layer 111, an intermediate support layer 112 on a side of the first conductive layer 111 away from the base substrate 10, and a second conductive layer 113 on a side of the intermediate support layer 112 away from the first conductive layer 111. Herein, a side of the intermediate support layer 112 close to the first conductive layer 111 includes a first groove; a side of the first conductive layer 111 close to the intermediate support layer 112 includes a second protrusion correspondingly disposed and engaged with the first groove; in addition, a side of the intermediate support layer 112 away from the first conductive layer 111 includes a third groove, and a side of the second conductive layer 113 close to the intermediate support layer 112 includes a fourth protrusion correspondingly disposed and engaged with the third groove. Here, one first groove, one second protrusion, one third groove, and one fourth protrusion are shown in FIG. 4. In another exemplary embodiment, the first groove and the second protrusion may both be disposed to multiple, and the third groove and the fourth protrusion may both be disposed to one. Or, the first groove and the second protrusion may both be disposed to multiple, and the third groove and the fourth protrusion may both be disposed to multiple.

Figure 5:
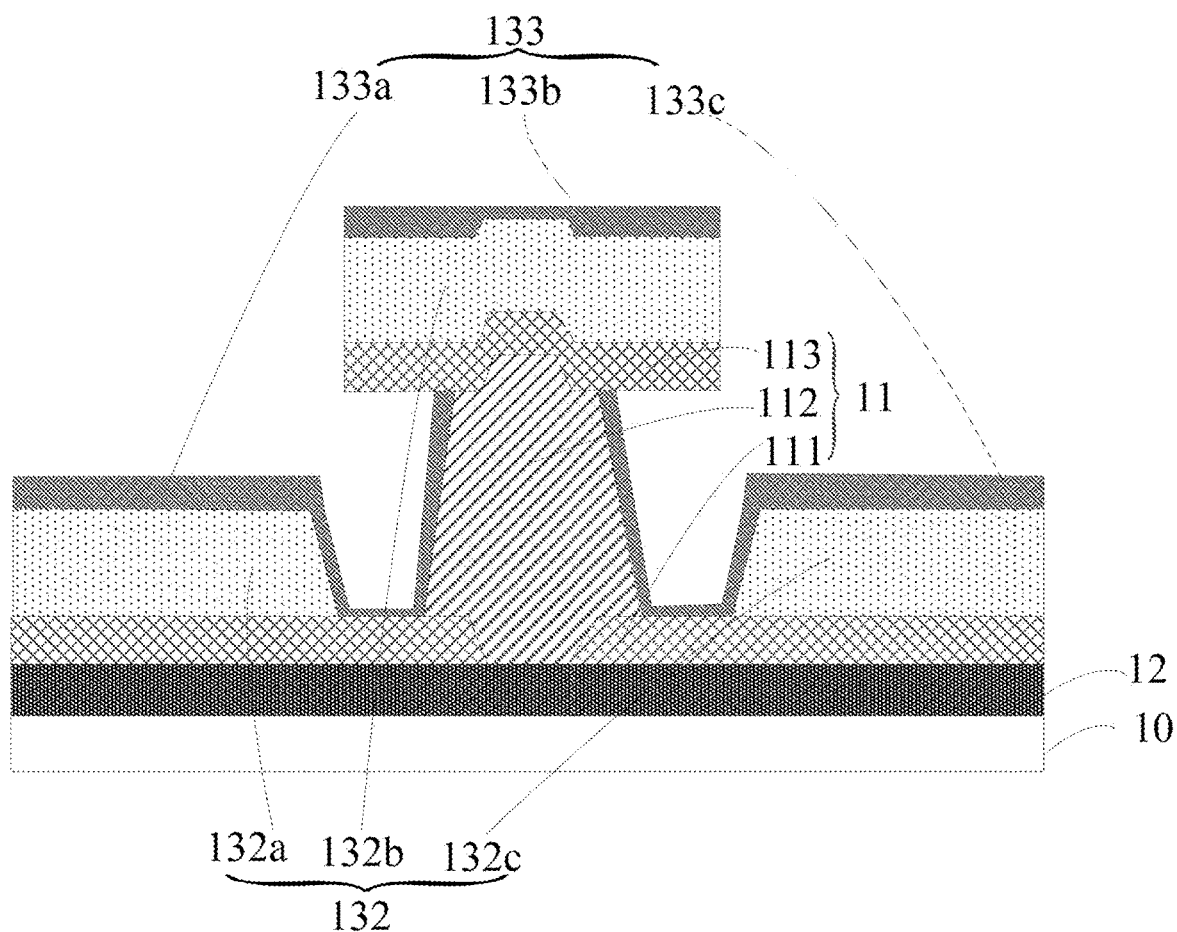
FIG. 5 is a schematic diagram of further another structure of a display substrate according to an embodiment of the present disclosure.
Figure 6:
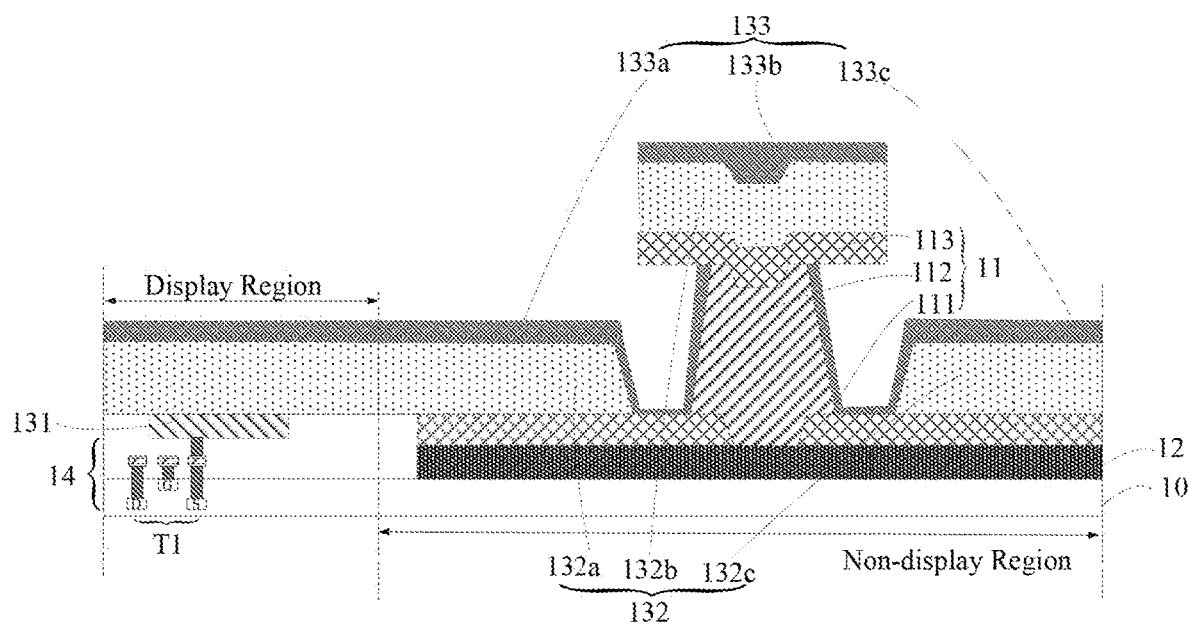
FIG. 6 is a schematic diagram of a structure of the display substrate when an auxiliary cathode structure in FIG. 2 is located in a non-display region.
Figure 7:
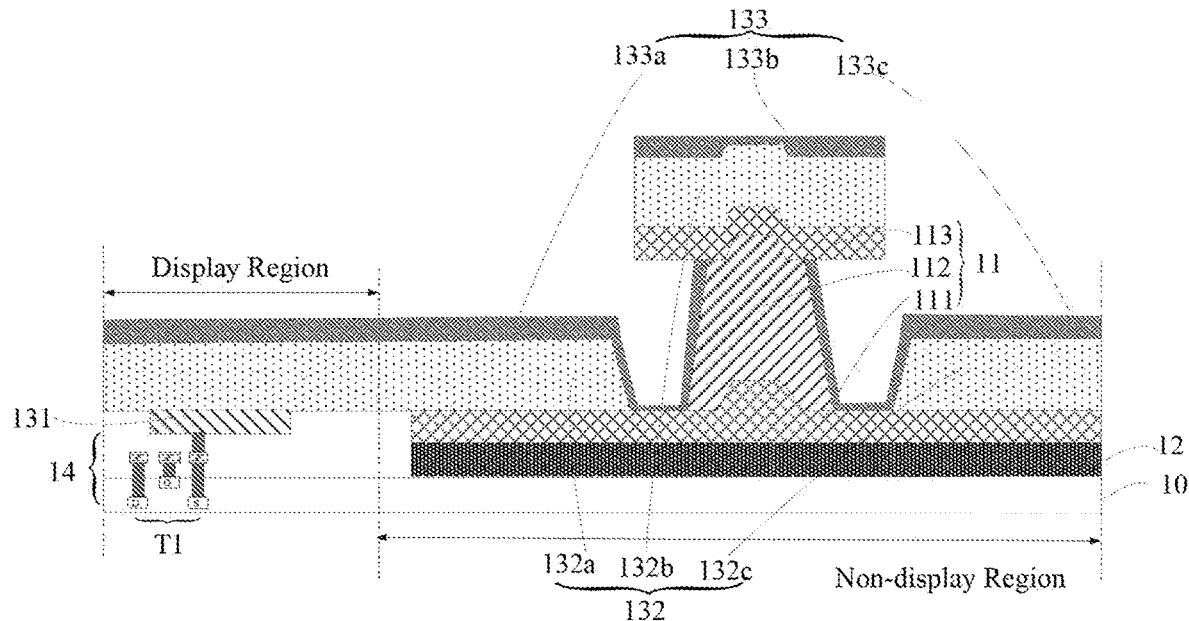
FIG. 7 is a schematic diagram of a structure of the display substrate when an auxiliary cathode structure in FIG. 3 is located in a non-display region.
Figure 8:
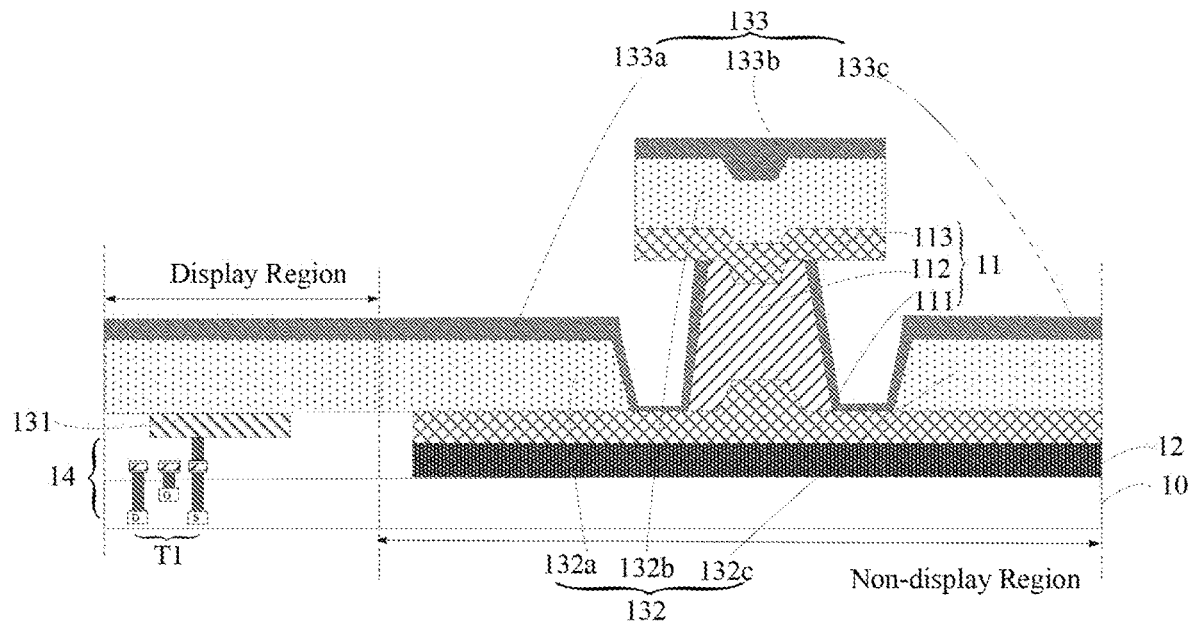
FIG. 8 is a schematic diagram of a structure of the display substrate when an auxiliary cathode structure in FIG. 4 is located in a non-display region.
Figure 9:
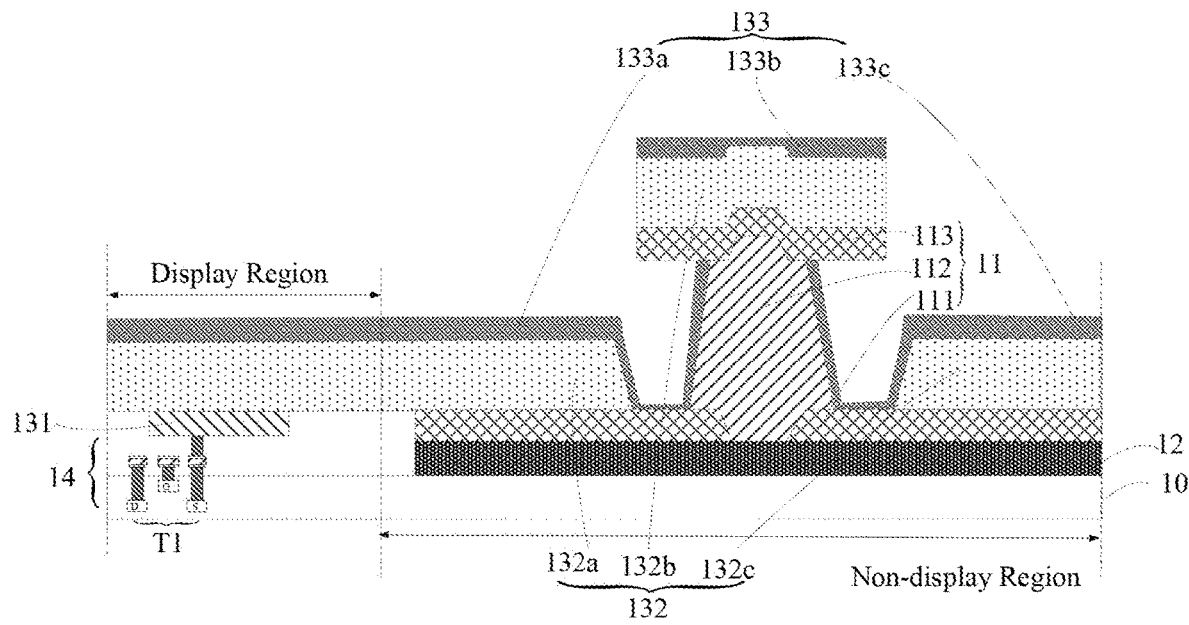
FIG. 9 is a schematic diagram of a structure of the display substrate when an auxiliary cathode structure in FIG. 5 is located in a non-display region.

FIG. 5 is a schematic diagram of further another structure of a display substrate according to an embodiment of the present disclosure. As shown in FIG. 5, on a plane parallel to the display substrate, the display substrate may include a base substrate 10, and an auxiliary cathode structure 11 on a side of the base substrate 10; the auxiliary cathode structure 11 may include a first conductive layer 111, an intermediate support layer 112 on a side of the first conductive layer 111 away from the base substrate 10, and a second conductive layer 113 on a side of the intermediate support layer 112 away from the first conductive layer 111. Herein, a side of the intermediate support layer 112 close to the first conductive layer 111 includes a first protrusion; a side of the first conductive layer 111 close to the intermediate support layer 112 includes a second groove correspondingly disposed and engaged with the first protrusion; in addition, a side of the intermediate support layer 112 away from the first conductive layer 111 includes a third protrusion, and a side of the second conductive layer 113 close to the intermediate support layer 112 includes a fourth groove correspondingly disposed and engaged with the third protrusion. Here, one first protrusion, one second groove, one third protrusion, and one fourth groove are shown in FIG. 5. In another exemplary embodiment, the first protrusion and the second groove may both be disposed to multiple, and the third protrusion and the fourth groove may both be disposed to one. Or, the first protrusion and the second groove may both be disposed to multiple, and the third protrusion and the fourth groove may both be disposed to multiple.

In an exemplary embodiment, at least one of the first protrusion, the second protrusion, the third protrusion, the fourth protrusion, the first groove, the second groove, the third groove, or the fourth groove may be any one of the following: a part of a cone (e.g., a part of a pyramid, or a part of a cone), a part of a sphere (e.g., a part of a hemisphere), or a part of a cylinder (e.g., a part of a prism, or a part of a cylinder).

In an exemplary embodiment, shapes of the first protrusion, the second protrusion, the third protrusion, and the fourth protrusion may be same.

In an exemplary embodiment, shapes of the first protrusion and the second groove may be same.

In an exemplary embodiment, shapes of the first groove and the second protrusion may be same.

In an exemplary embodiment, shapes of the third protrusion and the fourth groove may be same.

In an exemplary embodiment, shapes of the third groove and the fourth protrusion may be same.

For example, taking that the first protrusion, the second protrusion, the third protrusion, the fourth protrusion, the first groove, the second groove, the third groove, and the fourth groove may respectively be a part of the pyramid as an example, then, on a plane perpendicular to the display substrate, a cross-sectional shape of the first protrusion may be trapezoidal; a cross-sectional shape of the second protrusion may be trapezoidal; a cross-sectional shape of the third protrusion may be trapezoidal; a cross-sectional shape of the fourth protrusion may be trapezoidal; a cross-sectional shape of the first groove may be trapezoidal; a cross-sectional shape of the second groove may be trapezoidal; a cross-sectional shape of the third groove may be trapezoidal; a cross-sectional shape of the fourth groove may be trapezoidal.

For example, taking that the first protrusion, the second protrusion, the third protrusion, the fourth protrusion, the first groove, the second groove, the third groove and the fourth groove may respectively be a part of the sphere as an example, on a plane perpendicular to the display substrate, cross-sectional shapes of the first protrusion, the second protrusion, the third protrusion, the fourth protrusion, the first groove, the second groove, the third groove, and the fourth groove may all be semicircular.

In an exemplary embodiment, the grooves and the protrusions correspondingly disposed may have same shapes. For example, the first groove and the second protrusion corresponding to the first groove may both be a part of the pyramid, and the third groove and the fourth protrusion corresponding to the third groove may both be a part of the pyramid.

In an exemplary embodiment, as shown in FIG. 2, FIG. 3, FIG. 4, FIG. 5, FIG. 6, FIG. 7, FIG. 8, and FIG. 9, a cross-sectional shape of the auxiliary cathode structure 11 may be an I-shaped on a plane perpendicular to the display substrate.

In an exemplary embodiment, an area of an orthographic projection of the first conductive layer on the base substrate is larger than an area of an orthographic projection of the second conductive layer on the base substrate, and the area of the orthographic projection of the second conductive layer on the base substrate is larger than an area of an orthographic projection of the intermediate support layer on the base substrate.

In an exemplary embodiment, a material of the first conductive layer may be indium zinc oxide (IZO), or indium tin oxide (ITO), or another conductive material such as indium zinc tin oxide (IZTO). Here, this is not limited in the embodiment of the present disclosure.

In an exemplary embodiment, a material of the second conductive layer may be indium zinc oxide (IZO), or indium tin oxide (ITO), or another conductive material, such as indium zinc tin oxide (IZTO), etc., which is not limited hereto in the embodiment of the present disclosure.

In an exemplary embodiment, a material of the intermediate support layer may use any one of metal materials such as molybdenum (Mo), titanium (Ti), aluminum (Al), copper (Cu), or the like, or may use alloy materials made of any one or more of the above metal materials, such as molybdenum/aluminum alloy (Mo/Al), or molybdenum/niobium alloy (Mo/Nb), etc. In an exemplary embodiment, the alloy material may be of a single layer structure, or may be of a multi-layer composite structure, such as a composite structure composed of a Mo layer, an Al layer, and a Mo layer.

In an exemplary embodiment, in a plane perpendicular to the display substrate, a depth of at least one of the first groove, the second groove, the third groove, and the fourth groove is 1 μm (micrometers) to 10 μm. Correspondingly, a height of at least one of the first protrusion, the second protrusion, the third protrusion, or the fourth protrusion is 1 μm to 10 μm. For example, the height of the first protrusion may be 1.5 μm to 5 μm.

In an exemplary embodiment, as shown in FIG. 6, FIG. 7, FIG. 8, and FIG. 9, the display substrate may further include a light emitting device layer 13, wherein the light emitting device layer 13 is located in a display region on the base substrate, and the light emitting device layer 13 includes an anode 131, an organic light emitting layer 132, and a cathode 133 sequentially stacked on the base substrate 10, and the organic light emitting layer 132 and the cathode 133 extend to a non-display region around the display region; and the auxiliary cathode structure 11 may be located on a side of the organic light emitting layer 132 close to the base substrate 10 in the non-display region, and connected to the cathode 133.

In this way, a contact area between the intermediate support layer and the first conductive layer can be increased by fitting between the first protrusion and the second groove, or by fitting between the first groove and the second protrusion, so that the intermediate support layer and the first conductive layer are not easily separated, which may improve structural stability between the intermediate support layer and the first conductive layer. However, by fitting the third protrusion with the fourth groove, or by fitting the third groove with the fourth protrusion, a contact area between the intermediate support layer and the second conductive layer can be increased, which may improve structural stability between the intermediate support layer and the second conductive layer. Therefore, structural stability of the auxiliary cathode structure may be improved, thus it is caused that the intermediate support layer is not easily separated from the first conductive layer and the second conductive layer, and the support for the cathode is more stable. Furthermore, when the display substrate with the auxiliary cathode structure is applied to a flexible and bendable display product, flexible bending may be resisted, connection stability of bending bending in each direction may be improved, and a problem of easily breaking of the cathode appeared when the non-display region is relatively thin may also be avoided, improving product stability.

In an exemplary embodiment, a light emitting device layer may be an OLED device layer, such as a top emission-type OLED device layer.

In an exemplary embodiment, an organic light emitting layer may include: a hole injection layer (HIL), a hole transport layer (HTL), an electron block layer (EBL), an emitting layer (EML), a hole block layer (HBL), an electron transport layer (ETL), and an electron injection layer (EIL), which are stacked. In an exemplary embodiment, hole injection layers and electron injection layers of all sub-pixels may be common layers connected together, hole transport layers and electron transport layers of all sub-pixels may be common layers connected together, hole block layers of all sub-pixels may be common layers connected together, and light emitting layers and electron block layers of adjacent sub-pixels may overlap slightly, or be isolated.

In an exemplary embodiment, as shown in FIG. 2, FIG. 3, FIG. 4, FIG. 5, FIG. 6, FIG. 7, FIG. 8, and FIG. 9, in the non-display region, the organic light emitting layer 132 may include a first light emitting layer portion 132a, a second light emitting layer portion 132b, and a third light emitting layer portion 132c which are disconnected from each other, wherein the first light emitting layer portion 132a is located on a side of the first conductive layer 111 away from the base substrate 10, the second light emitting layer portion 132b is located on a side of the second conductive layer 113 away from the base substrate 10, and the third light emitting layer portion 132c is located on a side of the first conductive layer 111 away from the base substrate 10; and the second conductive layer 113 may be configured to block the organic light emitting layer 132.

In an exemplary embodiment, a material of the cathode may use a transparent conductive oxide, such as indium zinc oxide (IZO), etc.

In an exemplary embodiment, as shown in FIG. 2, FIG. 3, FIG. 4, FIG. 5, FIG. 6, FIG. 7, FIG. 8, and FIG. 9, in the non-display region, the cathode 133 may include a first electrode portion 133a, a second electrode portion 133b, and a third electrode portion 133c, wherein the first electrode portion 133a may be located on a side of the first light emitting layer portion 132a away from the base substrate 10, and connected to the first conductive layer 111, the second electrode portion 133b may be located on a side of the second light emitting layer portion 132b away from the base substrate 10, and the third electrode portion 133c may be located on a side of the third light emitting layer portion 132c away from the base substrate 10, and connected to the first conductive layer 111. Herein, illustration is made by taking the first electrode portion, the second electrode portion, and the third electrode portion disconnected from each other as an example, in FIG. 2, FIG. 3, FIG. 4, FIG. 5, FIG. 6, FIG. 7, FIG. 8, and FIG. 9.

In an exemplary embodiment, the first electrode portion, the second electrode portion, and the third electrode portion may be disconnected from each other, or the second electrode portion may be connected to at least one part of the first electrode portion and the third electrode portion which are adjacent.

In an exemplary embodiment, there may be an overlapping region between an orthographic projection of the second electrode portion on the base substrate and an orthographic projection of the third electrode portion on the base substrate; and there may be an overlapping region between an orthographic projection of the second electrode portion on the base substrate and an orthographic projection of the third electrode portion on the base substrate.

In an exemplary embodiment, a side of the second conductive layer away from the base substrate includes any one or more of at least one fifth protrusion and at least one fifth groove, and a side of the second light emitting layer portion close to the base substrate includes any one or more of at least one sixth groove engaged with the at least one fifth protrusion and at least one sixth protrusion engaged with the at least one fifth groove; and/or a side of the second light emitting layer portion away from the base substrate includes any one or more of at least one seventh protrusion and at least one seventh groove, and a side of the second electrode portion close to the base substrate includes any one or more of at least one eighth groove engaged with at least one seventh protrusion and at least one eighth protrusion engaged with the at least one seventh groove which are correspondingly disposed.

In this way, a contact area between the organic light emitting layer and the second conductive layer can be increased, by fitting between the fifth protrusion and the sixth groove, or by fitting between the fifth groove and the sixth protrusion, so that the organic light emitting layer and the second conductive layer are not easily separated, which may improve structural stability between the organic light emitting layer and the second conductive layer. However, by fitting between the seventh protrusion and the eighth groove, or by fitting between the seventh groove and the eighth protrusion, a contact area between the organic light emitting layer and the cathode can be increased, which may improve structural stability between the organic light emitting layer and the cathode. Therefore, through a film layer embedding effect, it may be caused that a bonding force is stronger, and effectiveness losing is more difficult, so that the structural stability of the auxiliary cathode structure, with the organic light emitting layer and the cathode may be improved, causing the intermediate support layer is not easily separated from the fifth conductive layer and the sixth conductive layer. Furthermore, when the display substrate with the auxiliary cathode structure is applied to a flexible and bendable display product, the flexible bending may be resisted, the connection stability of bending bending in each direction may be improved, and the product stability may be improved.

In an exemplary embodiment, as shown in FIGS. 3 and 5, the fifth protrusion is disposed on a side of the second conductive layer 113 away from the base substrate 10, and protrudes toward a direction away from the base substrate 10; and the sixth groove is disposed on a side of the second light emitting layer portion 132b close to the base substrate 10, and is recessed in the direction away from the base substrate 10.

In an exemplary embodiment, as shown in FIGS. 2 and 4, the fifth groove is disposed on a side of the second conductive layer 113 away from the base substrate 10, and is recessed toward a direction close to the base substrate 10; and the sixth protrusion is disposed on a side of the second light emitting layer portion 132b close to the base substrate 10, and protrudes toward the direction close to the base substrate 10.

In an exemplary embodiment, as shown in FIGS. 3 and 5, the seventh protrusion is disposed on a side of the second light emitting layer portion 132b away from the base substrate, and protrudes toward a direction away from the base substrate 10; and the eighth groove is disposed on a side of the second electrode portion 133b close to the base substrate 10, and is recessed toward the direction away from the base substrate 10.

In an exemplary embodiment, as shown in FIGS. 2 and 4, the seventh groove is disposed on a side of the second light emitting layer portion 132b away from the base substrate 10, and is recessed toward a direction close to the base substrate 10; and the eighth protrusion is disposed on a side of the second electrode portion 133b close to the base substrate 10, and protrudes toward the direction close to the base substrate 10.

In an exemplary embodiment, quantities of the fifth protrusion, the sixth protrusion, the seventh protrusion, the eighth protrusion, the fifth groove, the sixth groove, the seventh groove, and the eighth groove may be set arbitrarily. For example, the quantities of the fifth protrusion, the sixth protrusion, the seventh protrusion, the eighth protrusion, the fifth groove, the sixth groove, the seventh groove, and the eighth groove may all be one or more. Herein, the quantities of the fifth protrusion and the sixth groove may be same, the quantities of the fifth groove and the sixth protrusion may be same, the quantities of the seventh protrusion and the eighth groove may be same, and the quantities of the seventh groove and the eighth protrusion may be same.

In an exemplary embodiment, when quantities of grooves and protrusions which are corresponding disposed may both be multiple, the grooves and the protrusions corresponding to them are all disposed in a one-to-one correspondence, and the protrusions can engage into their corresponding grooves. For example, taking the quantities of the fifth protrusions and the sixth grooves both being multiple as an example, the fifth protrusions and the sixth grooves are disposed in a one-to-one correspondence, and each fifth protrusion may engage into its corresponding sixth groove.

In an exemplary embodiment, at least one of the fifth protrusion, the sixth protrusion, seventh protrusion, the eighth protrusion, the fifth groove, the sixth groove, the seventh groove, and the eighth groove may be any one of the following: a part of a cone (for example, a part of a pyramid, or a part of a cone), a part of a sphere (for example, a part of a hemisphere), and a part of a cylinder (for example, a part of a prism, or a part of a cylinder).

In an exemplary embodiment, shapes of the fifth protrusion, the sixth protrusion, the seventh protrusion, and the eighth protrusion may be same.

In an exemplary embodiment, shapes of the fifth protrusion and the sixth groove may be same.

In an exemplary embodiment, shapes of the fifth groove and the sixth protrusion may be same.

In an exemplary embodiment, shapes of the seventh protrusion and the eighth groove may be same.

In an exemplary embodiment, shapes of the seventh groove and the eighth protrusion may be same.

For example, taking that the fifth protrusion, the sixth protrusion, the seventh protrusion, the eighth protrusion, the fifth groove, the sixth groove, the seventh groove, and the eighth groove may be a part of the pyramid as an example, then, a cross-sectional shape of the fifth protrusion may be trapezoidal on a plane perpendicular to the display substrate; a cross-sectional shape of the sixth protrusion may be trapezoidal; a cross-sectional shape of the seventh protrusion may be trapezoidal; a cross-sectional shape of the eighth protrusion may be trapezoidal; a cross-sectional shape of the fifth groove may be trapezoidal; a cross-sectional shape of the sixth groove may be trapezoidal; a cross-sectional shape of the seventh groove may be trapezoidal; and a cross-sectional shape of the eighth groove may be trapezoidal.

In an exemplary embodiment, the grooves and the protrusions which are correspondingly disposed may have same shapes. For example, the fifth protrusion and the sixth groove corresponding to the fifth protrusion may both be part of the pyramid.

In an exemplary embodiment, an area of an orthographic projection of the first light emitting layer portion on the base substrate may be smaller than an area of an orthographic projection of the first electrode portion on the base substrate, and an area of an orthographic projection of the third light emitting layer portion on the base substrate may be smaller than an area of an orthographic projection of the third electrode portion on the base substrate.

In an exemplary embodiment, as shown in FIGS. 6, 7, 8, and 9, the display substrate may further include a pixel circuit layer 14, wherein the pixel circuit layer 14 is located on a side of the light emitting device layer 13 close to the base substrate.

For example, the pixel circuit layer 14 may include multiple pixel circuits, configured to drive light emitting elements (e.g., OLEDs) in the light emitting device layer, and a pixel circuit of each sub-pixel may include multiple transistors and storage capacitors. Here, circuit structures and layouts of the pixel circuits may be designed according to an actual application, which are not limited hereto in the embodiments of the present disclosure. For clarity and conciseness, FIGS. 6, 7, 8, and 9 only schematically show one transistor T1 of each of pixel circuit, wherein the transistor T1 is used for coupling to the light emitting element in the light emitting device layer. For example, as shown in FIGS. 6, 7, 8, and 9, taking the transistor T1 as an example, transistors in the pixel circuit layer 14 all include gate electrodes G, source electrodes S, and drain electrodes D. For example, the anode 131 may be electrically connected to the source electrode S of the transistor T1 in the corresponding pixel circuit through a tungsten via hole (via a corresponding connection portion of the source electrode S). It may be understood that positions of the source electrode S and the drain electrode D may be interchanged, that is, the anode 131 may be electrically connected to the drain electrode D instead.

In an exemplary embodiment, as shown in FIG. 2, FIG. 3, FIG. 4, FIG. 5, FIG. 6, FIG. 7, FIG. 8, and FIG. 9, the display substrate may further include a metal wiring layer 12 located between the first conductive layer 111 and the base substrate 10.

In an exemplary embodiment, as shown in FIGS. 2, 5, 6, and 9, at least one second groove penetrates through the first conductive layer 111, and exposes the metal wiring layer 12, so that the intermediate support layer 112 is connected to the metal wiring layer 12 through at least one second groove and at least one first protrusion. In this way, it is not only caused that the intermediate support layer may be connected to the first conductive layer, but also it is caused that the intermediate support layer may be connected to the metal wiring layer, so that an adhesive force is diversified, and further, product stability can be improved more effectively.

In an exemplary embodiment, a material of the metal wiring layer may use any one of metal materials such as molybdenum (Mo), niobium (Nb), aluminum (Al), copper (Cu), etc., or may use an alloy material made of any one or more of the above metal materials, such as molybdenum/niobium alloy (Mo/Nb), molybdenum/copper alloy (Mo/Cu), molybdenum/niobium/copper alloy (Mo/Nb/Cu), aluminum/neodymium alloy (Al/Nd), etc. In an exemplary embodiment, the alloy material may be of a single layer structure, or may be of a multi-layer composite structure, such as a composite structure composed of a Mo layer, a Nb layer, and an Mo layer.

For example, the metal wiring layer may include various wirings such as scan signal lines and data signal lines, which is not limited hereto in the embodiment of the present disclosure.

In an exemplary embodiment, the base substrate may be a flexible dielectric substrate, for example, a Polyimide (PI) substrate, which is not limited hereto in the embodiment of the present disclosure.

In an exemplary embodiment, the display substrate may be an OLED display substrate or a Micro-OLED display substrate.

In addition, the display substrate may also include another necessary component and structure, such as a spacer column, in addition to the above-mentioned base substrate, the auxiliary cathode structure, and the light emitting elements, which may be designed and supplemented by those skilled in the art according to types of the display substrate, and will not be repeated here again.

A structure of a display substrate according to the embodiments of the present disclosure is described below through a process for preparing a display substrate. Herein, the "patterning process" mentioned in the embodiment of the present disclosure includes processing such as a film layer deposition, photoresist coating, a mask exposure, a development, etching, or photoresist stripping, etc. Deposition may use any one or more of sputtering, evaporation, or a chemical vapor deposition, coating may use any one or more of spraying, or spin coating, and etching may use any one or more of dry etching and wet etching. A "thin film" may refer to one layer of thin film manufactured by deposition or coating process of a certain material on a base. When the "thin film" does not need a patterning process throughout the fabrication process, then the "thin film" may be referred to as a "layer". When the "thin film" needs the patterning process throughout the whole fabrication process, then it is called a "thin film" before the patterning process, and called a "layer" after the patterning process. The "layer" subsequent to the patterning process contains at least one "pattern". "A and B are disposed on a same layer" in the embodiments of the present invention, refers to that A and B are formed simultaneously by a same patterning process.

Taking the display substrate as shown in FIG. 2 as an example, the technical solutions of the embodiments of the present disclosure will be described through the preparation process of the display substrate provided by the embodiments of the present disclosure.

As shown in FIGS. 10A to 10C, and FIG. 2, a method for preparing an array substrate according to an embodiment of the present disclosure may include S101 to S105.

Figure 10A:
FIG. 10A is a schematic diagram after a metal wiring layer is formed according to an embodiment of the present disclosure.

In the S101, as shown in FIG. 10A, a metal wiring layer 12 is formed on a base substrate 10.

Figure 10B:
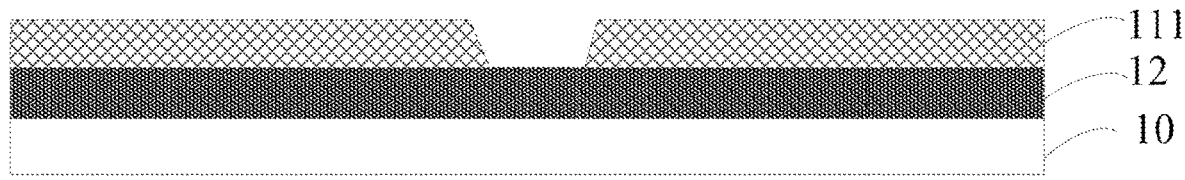
FIG. 10B is a schematic diagram after a first conductive layer is formed according to an embodiment of the present disclosure.

In the S102, as shown in FIG. 10B, a first conductive layer 111 is formed on the metal wiring layer 12, wherein the first conductive layer 111 includes a second groove penetrating through the first conductive layer 111.

Figure 10C:
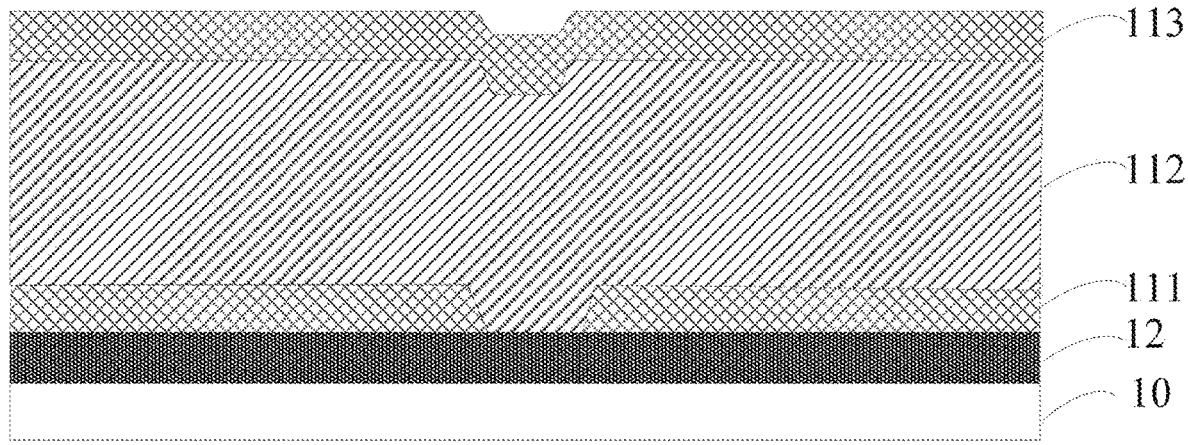
FIG. 10C is a schematic diagram after an intermediate support layer and a second conductive layer are formed according to an embodiment of the present disclosure.
Figure 10D:
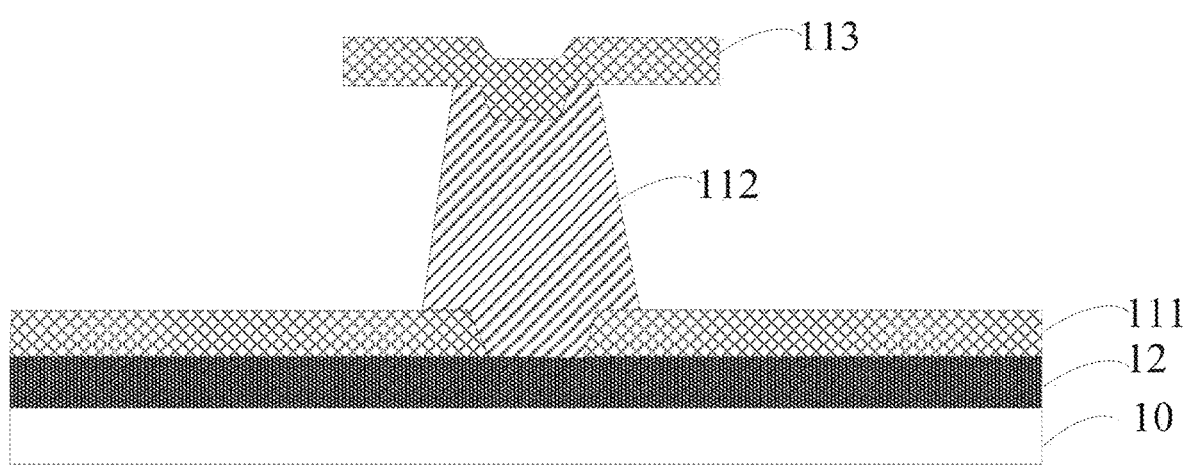
FIG. 10D is a schematic diagram after a second conductive layer and an intermediate support layer are etched according to an embodiment of the present disclosure.

In the S103, as shown in FIG. 10C, and FIG. 10D, an intermediate support layer 112 and a second conductive layer 113 are formed on the first conductive layer 111, wherein a side of the intermediate support layer 112 close to the first conductive layer 111 includes a first protrusion, a side of the intermediate support layer 112 away from the first conductive layer 111 includes a third groove, and a side of the second conductive layer 113 close to the intermediate support layer 112 includes a fourth protrusion, and a side of the second conductive layer 113 away from the intermediate support layer 112 includes a fifth groove.

Figure 10E:
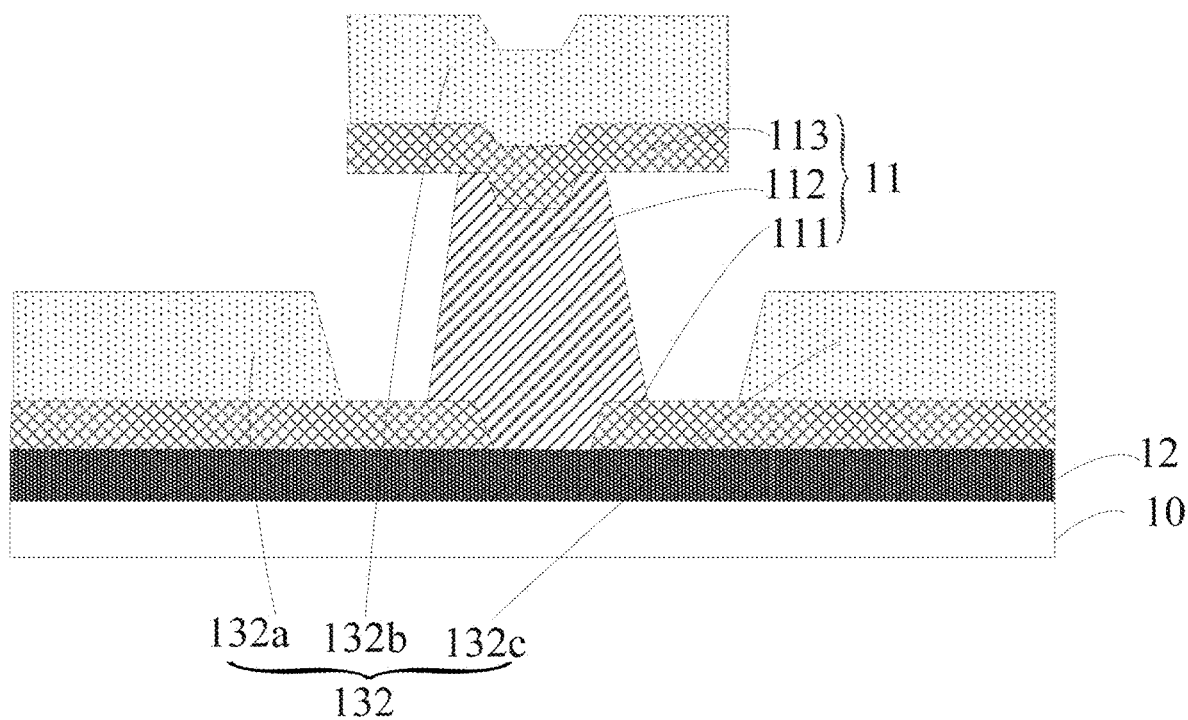
FIG. 10E is a schematic diagram after an organic light emitting layer is formed according to an embodiment of the present disclosure.

In the S104, as shown in FIG. 10E, an organic light emitting layer 132 is formed on the first conductive layer 111 and the second conductive layer 113, wherein, a side of the organic light emitting layer 132 close to the base substrate 10 includes a sixth protrusion, and a side of the organic light emitting layer 132 away from the base substrate includes a seventh groove.

In the S105, as shown in FIG. 2, a cathode 133 is formed on the organic light emitting layer 132, wherein a side of the cathode 133 close to the base substrate includes an eighth protrusion.

In an exemplary embodiment, the S101 may include a metal wiring thin film is deposited on the base substrate 10. In this way, a metal wiring layer may be formed on the base substrate 10.

In an exemplary embodiment, the metal wiring thin film may use a metal material such as aluminum, copper, molybdenum, titanium, niobium, silver, gold, tantalum, tungsten, chromium, or other materials, or may use a conductive oxide such as indium tin oxide (ITO), indium zinc oxide (IZO), zinc oxide (ZnO), indium oxide (In2O3), aluminum-doped zinc oxide (AlZn0), etc. It may be of a single-layer structure, or of a multilayer composite structure. It may be deposited by a radio frequency magnetic control sputter method.

In an exemplary embodiment, the S102 may include: a first conductive film is deposited on the metal wiring layer 12; one layer of photoresist is coated on the first conductive thin film, and a step exposure and a development are performed on the photoresist by using a halftone or gray tone mask version, forming a completely exposed region (without photoresist) at a position of the second groove, and forming an unexposed region (having photoresist with a first thickness) at another position; and etching is performed on the completely exposed region by an etching process, etching off the first conductive thin film in the region. In this way, the first conductive layer 111 may be formed on the metal wiring layer 12, and the second groove penetrating through the first conductive layer 111 may be formed.

In an exemplary embodiment, the first conductive thin film may use a conductive oxide such as indium zinc oxide (IZO), or indium tin oxide (ITO), or indium zinc tin oxide (IZTO), etc. It may be of a single-layer structure, or of a multi-layer composite structure. For example, the first conductive thin film may be deposited by the radio frequency magnetic control sputter method.

In an exemplary embodiment, as shown in FIGS. 10C and 10D, the S103 may include S1031 to S1038.

In the S1031, a support layer thin film is deposited on the first conductive layer 111, and a first protrusion is formed at a position corresponding to the second groove on a side of the support layer thin film close to the first conductive layer 111.

In the S1032, a layer of photoresist is coated on a side of the support layer thin film away from the first conductive layer 111, and a step exposure and a development are performed on the photoresist by using a halftone or gray tone mask version, forming a completely exposed region (without photoresist) at a position of the third groove, forming a partially exposed region (photoresist with a second thickness) in a region at a predetermined distance from both sides of a position of the third groove, and forming an unexposed region (photoresist with a first thickness) at another position.

In the S1033, the completely exposed region in the support layer thin film is etched by a first time of etching process, etching off the support layer thin film in this region, and forming the third groove on a side of the support layer thin film away from the first conductive layer 111.

In the S1034, a second conductive thin film is deposited on the support layer thin film, and a fourth protrusion is formed at a position corresponding to the third groove on a side of the second conductive thin film close to the base substrate.

In the S1035, one layer of photoresist is coated on a side of the second conductive thin film away from the base substrate 10, and a step exposure and a development are performed on the photoresist by using a halftone or gray tone mask version, forming a completely exposed region (without photoresist) at a position of the fifth groove, and forming an unexposed region (photoresist with the first thickness) at another position.

In the S1036, the completely exposed region in the second conductive thin film is etched by an etching process, etching off the second conductive thin film in this region, and forming the fifth groove on a side of the second conductive thin film away from the base substrate 10.

In the S1037, the photoresist in the partially exposed region in the support layer thin film is removed through an ashing process, exposing the support layer thin film in this region.

In the S1038, the support layer thin film in the partially exposed region is etched through a second time of etching process, the support layer thin film in this region is etched off, and the remaining photoresist is stripped, forming an I-shaped auxiliary cathode structure 11 on the metal wiring layer, and leaving part of the support layer thin film under the second conductive layer 113, wherein, an orthographic projection of the part of the support layer thin film on the base substrate 10 is smaller than an orthographic projection of the second conductive layer 113 on the base substrate.

In an exemplary embodiment, the support layer thin film may use any one of metal materials such as molybdenum (Mo), titanium (Ti), aluminum (Al), or copper (Cu), etc., or alloy materials made of any one or more of the above metal materials, such as molybdenum/aluminum alloy (Mo/Al), or molybdenum/niobium alloy (Mo/Nb), etc. In an exemplary embodiment, the alloy material may be of a single layer structure, or may be of a multi-layer composite structure, such as a composite structure composed of an Mo layer, an Al layer, or an Mo layer. For example, the support layer thin film may be deposited by the radio frequency magnetic control sputter method.

In an exemplary embodiment, the second conductive thin film may use a conductive oxide such as indium zinc oxide (IZO), indium tin oxide (ITO), or indium zinc tin oxide (IZTO), etc., which may be of a single-layer structure, or may be of a multi-layer composite structure. For example, the second conductive thin film may be deposited by the radio frequency magnetic control sputter method.

In an exemplary embodiment, the S105 may include: a cathode thin film is deposited on the organic light emitting layer 132, and the eighth protrusion is formed at a position corresponding to the seventh groove on a side of the cathode thin film close to the base substrate 10.

In an exemplary embodiment, the cathode thin film may use a transparent conductive oxide, such as indium zinc oxide (IZO), etc., and may be deposited by the radio frequency magnetic control sputter method.

An embodiment of the present disclosure further provides a display substrate, which may include the display substrate in one or more foregoing embodiments.

In an exemplary embodiment, the display apparatus may be any product or component with a display function such as a mobile phone, a tablet, a television, a display, a laptop, a digital photo frame, or a navigator, etc. Types of the display apparatus are not limited hereto in the embodiment of the present disclosure.

In an exemplary embodiment, the display apparatus may be a flexible and bendable display apparatus. For example, a foldable mobile phone, or a foldable tablet, etc.

Although the embodiments disclosed in the present disclosure are as above, the contents described above are only embodiments adopted for the convenience of understanding the present disclosure, and are not used to limit the present disclosure. Any person skilled in the art to which the present disclosure belongs may make any modification and change in the form and details of implementation without departing from the spirit and the scope disclosed in the present disclosure. However, the scope of protection of the present disclosure shall still be subject to the scope defined in the appended claims.

What is claimed is:

1. A display substrate, comprising: a base substrate, and an auxiliary cathode structure located on a side of the base substrate; wherein,
the auxiliary cathode structure comprises a first conductive layer, an intermediate support layer located on a side of the first conductive layer away from the base substrate, and a second conductive layer located on a side of the intermediate support layer away from the first conductive layer; wherein,
a side of the intermediate support layer close to the first conductive layer comprises any one or more of at least one first protrusion and at least one first groove, and a side of the first conductive layer close to the intermediate support layer comprises any one or more of at least one second groove engaged with the at least one first protrusion and at least one second protrusion engaged with the at least one first groove which are correspondingly disposed;
and/or,
a side of the intermediate support layer away from the first conductive layer comprises any one or more of at least one third protrusion and at least one third groove, and a side of the second conductive layer close to the intermediate support layer comprises any one or more of at least one fourth groove engaged with the at least one third protrusion and at least one fourth protrusion engaged with the at least one third groove which are correspondingly disposed;
wherein an area of an orthographic projection of the first conductive layer on the base substrate is larger than an area of an orthographic projection of the second conductive layer on the base substrate, and the area of the orthographic projection of the second conductive layer on the base substrate is larger than an area of an orthographic projection of the intermediate support layer on the base substrate.

2. The display substrate of claim 1, wherein a material of the first conductive layer and a material of the second conductive layer comprise any one or more of indium zinc oxide and indium tin oxide.

3. The display substrate of claim 1, wherein a material of the intermediate support layer comprises molybdenum/aluminum alloy.

4. The display substrate of claim 1, wherein, in a plane perpendicular to the display substrate, a depth of at least one of the first groove, the second groove, the third groove, and the fourth groove is 1 µm to 10 µm.

5. The display substrate of claim 1, further comprising a light emitting device layer, wherein the light emitting device layer is located in a display region on the base substrate, and a light emitting device comprises an anode, an organic light emitting layer, and a cathode sequentially stacked on the base substrate, the organic light emitting layer and the cathode extending to a non-display region around the display region;
wherein the auxiliary cathode structure is located on a side of the organic light emitting layer in the non-display region close to the base substrate, and is connected to the cathode.

6. The display substrate of claim 5, wherein in the non-display region, the organic light emitting layer comprises a first light emitting layer portion, a second light emitting layer portion and a third light emitting layer portion which are disconnected from each other, wherein the first light emitting layer portion is located on a side of the first conductive layer away from the base substrate, the second light emitting layer portion is located on a side of the second conductive layer away from the base substrate, and the third light emitting layer portion is located on the side of the first conductive layer away from the base substrate;
wherein the second conductive layer is configured to block the organic light emitting layer.

7. The display substrate of claim 6, wherein in the non-display region, the cathode comprises a first electrode portion, a second electrode portion, and a third electrode portion, wherein the first electrode portion is located on a side of the first light emitting layer portion away from the base substrate and connected to the first conductive layer, the second electrode portion is located on a side of the second light emitting layer portion away from the base substrate, and the third electrode portion is located on a side of the third light emitting layer portion away from the base substrate and connected to the first conductive layer.

8. The display substrate of claim 7, wherein an orthographic projection of the second electrode portion on the base substrate and an orthographic projection of the first electrode portion and the third electrode portion on the base substrate have an overlapping region.

9. The display substrate of claim 7, wherein,
a side of the second conductive layer away from the base substrate comprises any one or more of at least one fifth protrusion and at least one fifth groove, and a side of the second light emitting layer portion close to the base substrate comprises any one or more of at least one sixth groove engaged with the at least one fifth protrusion and at least one sixth protrusion engaged with the at least one fifth groove which are correspondingly disposed;

and/or, a side of the second light emitting layer portion away from the base substrate comprises any one or more of at least one seventh protrusion and at least one seventh groove, and a side of the second electrode portion close to the base substrate comprises any one or more of at least one eighth groove engaged with the at least one seventh protrusion and at least one eighth protrusion engaged with the at least one seventh groove which are correspondingly disposed.

10. The display substrate of claim 7, wherein an area of an orthographic projection of the first light emitting layer portion on the base substrate is smaller than an area of an orthographic projection of the first electrode portion on the base substrate, and an area of an orthographic projection of the third light emitting layer portion on the base substrate is smaller than an area of an orthographic projection of the third electrode portion on the base substrate.

11. The display substrate of claim 1, further comprising a metal wiring layer located between the first conductive layer and the base substrate, wherein,
the at least one second groove penetrates through the first conductive layer and exposes the metal wiring layer, so that the intermediate support layer is connected to the metal wiring layer through the at least one second groove and the at least one first protrusion.

12. A display apparatus, comprising a display substrate, wherein the display substrate comprises: a base substrate and an auxiliary cathode structure located on a side of the base substrate; the auxiliary cathode structure comprises a first conductive layer, an intermediate support layer located on a side of the first conductive layer away from the base substrate, and a second conductive layer located on a side of the intermediate support layer away from the first conductive layer; wherein,
a side of the intermediate support layer close to the first conductive layer comprises any one or more of at least one first protrusion and at least one first groove, and a side of the first conductive layer close to the intermediate support layer comprises any one or more of at least one second groove engaged with the at least one first protrusion and at least one second protrusion engaged with the at least one first groove which are correspondingly disposed;

and/or, a side of the intermediate support layer away from the first conductive layer comprises any one or more of at least one third protrusion and at least one third groove, and a side of the second conductive layer close to the intermediate support layer comprises any one or more of at least one fourth groove engaged with the at least one third protrusion and at least one fourth protrusion engaged with the at least one third groove which are correspondingly disposed;

wherein an area of an orthographic projection of the first conductive layer on the base substrate is larger than an area of an orthographic projection of the second conductive layer on the base substrate, and the area of the orthographic projection of the second conductive layer on the base substrate is larger than an area of an orthographic projection of the intermediate support layer on the base substrate.

13. The display apparatus of claim 12, wherein a material of the first conductive layer and a material of the second conductive layer comprise any one or more of indium zinc oxide and indium tin oxide.

14. The display apparatus of claim 12, wherein a material of the intermediate support layer comprises molybdenum/aluminum alloy.

15. The display apparatus of claim 12, wherein, in a plane perpendicular to the display substrate, a depth of at least one of the first groove, the second groove, the third groove, and the fourth groove is 1 µm to 10 µm.

16. The display apparatus of claim 12, wherein the display substrate further comprises a light emitting device layer, wherein the light emitting device layer is located in a display region on the base substrate, and a light emitting device comprises an anode, an organic light emitting layer, and a cathode sequentially stacked on the base substrate, the organic light emitting layer and the cathode extending to a non-display region around the display region;
wherein the auxiliary cathode structure is located on a side of the organic light emitting layer in the non-display region close to the base substrate, and is connected to the cathode.

17. The display apparatus of claim 12, wherein the display substrate further comprises a metal wiring layer located between the first conductive layer and the base substrate, wherein,
the at least one second groove penetrates through the first conductive layer and exposes the metal wiring layer, so that the intermediate support layer is connected to the metal wiring layer through the at least one second groove and the at least one first protrusion.

* * * * *